US007276764B1

(12) United States Patent
Sakamoto

(10) Patent No.: US 7,276,764 B1
(45) Date of Patent: Oct. 2, 2007

(54) SEMICONDUCTOR DEVICE WITH METAL WIRE LAYER MASKING

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 739 days.

(21) Appl. No.: 09/208,105

(22) Filed: Nov. 25, 1998

Related U.S. Application Data

(63) Continuation of application No. PCT/JP98/01325, filed on Mar. 25, 1998.

(30) Foreign Application Priority Data

Mar. 25, 1997 (JP) .................................. 9-071056

(51) Int. Cl.
*H01L 29/76* (2006.01)
(52) U.S. Cl. ...................... 257/329; 257/131; 257/156; 257/340; 257/376
(58) Field of Classification Search ................ 257/328, 257/329, 340, 378, 784, 133, 131, 156, 376, 257/424, 523, 590, 617; 438/269
See application file for complete search history.

(56) References Cited

U.S. PATENT DOCUMENTS

| 4,134,778 A | | 1/1979 | Sheng et al. | |
| 4,682,195 A | | 7/1987 | Yilmaz | |
| 4,752,818 A | * | 6/1988 | Kushida et al. | ............... 357/38 |
| 5,025,293 A | | 6/1991 | Seki | |
| 5,075,751 A | * | 12/1991 | Tomii et al. | .................. 357/38 |
| 5,169,793 A | | 12/1992 | Okabe et al. | |
| 5,539,244 A | * | 7/1996 | Mori et al. | .................. 257/784 |
| 5,644,148 A | * | 7/1997 | Kinzer | ........................ 257/133 |
| 5,808,352 A | * | 9/1998 | Sakamoto | ..................... 257/590 |
| 5,981,981 A | * | 11/1999 | Takahashi | ..................... 257/133 |

FOREIGN PATENT DOCUMENTS

| EP | 0 213 972 | 3/1987 |
| JP | 51-46882 | 4/1976 |
| JP | 54-002076 | 1/1979 |
| JP | 54-2076 | 1/1979 |
| JP | 54-53873 | 4/1979 |
| JP | 55-154767 | * 12/1980 |

(Continued)

OTHER PUBLICATIONS

Esaki, et al., "A 900 MHz 100 W VD-Mosfet with Silicide Gate Self-aligned Channel", International Electron Devices Meeting. Technical Digest, Dec. 1984, pp. 447-450.

(Continued)

*Primary Examiner*—Ori Nadav
(74) *Attorney, Agent, or Firm*—Hamre, Schumann, Mueller & Larson, P.C.

(57) ABSTRACT

An object of the present invention is to provide a semiconductor device capable of radiating electron-beams only to a desired region without forming a layer for restricting the radiating rays. A source electrode 22 made of aluminum prevents the generation of bremsstrahlung even when the electron-beams are radiated to the source electrode in a exposed condition. Also, the source electrode having an opening 25 at above of a crystal defect region 11 is used as a mask when the electron-beams are radiated thereto. That is the source electrode made of aluminum can be used both as a wiring and a mask for the radiating rays.

6 Claims, 10 Drawing Sheets

FOREIGN PATENT DOCUMENTS

| | | |
|---|---|---|
| JP | 62-54961 | 3/1987 |
| JP | 62-298120 | 12/1987 |
| JP | 64-19771 | 1/1989 |
| JP | 1-235272 | 9/1989 |
| JP | 1-287965 | 11/1989 |
| JP | 2-196471 | 8/1990 |
| JP | 3-259537 | 11/1991 |
| JP | 4-229661 | 8/1992 |
| JP | 7-135214 | 5/1995 |
| JP | 7-297414 | * 11/1995 |
| JP | 2526653 | 6/1996 |
| JP | 8-227895 | 9/1996 |
| JP | 2858404 | 12/1998 |

OTHER PUBLICATIONS

Akiyama, et al., "Partial Lifetime Control in IFBT by Helium Irradiation Through Mask Patterns", Power Semiconductor Devices and ICS, 1991. International Symposium on Baltimore, MD, USA Apr. 22-24, 1991, New York, NY, USA, IEEE, US, Apr. 22, 1991, pp. 187-191.

Notice of Reasons for Refusal issued in counterpart Japanese application No. H09-071056, Feb. 19, 2007, pp. 1-4 (with its full English Translation).

* cited by examiner

<PRIOR ART>

<PRIOR ART>

SEMICONDUCTOR DEVICE WITH METAL WIRE LAYER MASKING

This is a Continuation application of PCT Application No. PCT/JP98/01325, filed Mar. 25, 1998.

FIELD OF THE INVENTION

The present invention relates to a semiconductor device, a part of which is irradiated by radiating rays, more specifically, a technology for radiating a part of the semiconductor.

BACKGROUND ART

An insulated gate bipolar transistor (hereinafter referred to as IGBT) 80 shown in FIG. 9 is known as a semiconductor device having a planar type high voltage-proof vertical element. The IGBT 80 is a semiconductor device which has both a high input impedance characteristic observed in a metal oxide field effect transistor (hereinafter referred to as MOSFET) and a low saturation voltage characteristic known as a characteristic of a bipolar transistor.

A substrate 82 used for the IGBT 80 includes a drain layer 3 with P+ type, an n+ type layer 5 and an n− type layer 7. Base regions 21 are formed in the n− type layer 7, and source regions 23 with n+ type are formed within the base regions 21. The surface of the n− type semiconductor layer 82 is covered with a gate oxidation layer 22.

Incidentally, a loss caused by switching arises as a result of a parasitic diode generated on a plane of a PN (positive-negative) junction 59. Japanese Patent laid-open publication No. Hei 7-135214 discloses a technology for selectively radiating electron-beams using a mask 41 shown in FIG. 9 during the manufacturing processes in order to avoid the generation of the parasitic diode. The beams pass through through-holes 43 formed in the mask 41 and irradiate on the IGBT 80. In this way, the life-time of carriers located on the plane of the PN junction 59 where the parasitic diode being generated can be shortened as a result of forming crystal defects 61.

In the manufacturing processes described above, unexpected variation of the threshold voltage in the IGBT 80 is possible because of generation of bremsstrahlung caused by the material of the mask 41 made generally of a heavy metal such as lead and the like.

Japanese Patent laid-open publication No. Hei 8-227895 discloses another IGBT 90 having layers for restricting electron-beams. As shown in FIG. 10, a layer 69 made of silicon nitride for restricting the beams is formed under a source electrode. Generation of bremsstrahlung is restricted even when the beams are radiated to the IGBT 90 due to masking by the restriction layer 69.

However, the number of processes is increased because the processes for forming the restriction layers 69 made of silicon nitride is required in the conventional method.

DISCLOSURE OF THE PRESENT INVENTION

It is an object of the present invention to overcome the above mentioned drawbacks associated with the prior art, and to provide a semiconductor device and a method for manufacturing thereof capable of radiating electron-beams to the desired region with simple processes, while not providing adverse effects caused by bremsstrahlung even when the electron-beams are radiated.

In accordance with characteristics of the present invention, there is provided a semiconductor device comprising:

a substrate having a region to be irradiated with radiating rays, and a metal wiring layer located on the substrate one of directly and indirectly, wherein the metal wiring layer is made of a light metal, and wherein the metal wiring layer located on the region to be irradiated is formed thinner than that formed on regions except for the region to be irradiated.

Also, in accordance with characteristics of the present invention, there is provided a semiconductor device comprising:

a metal wiring layer located on the substrate, wherein the metal wiring layer is made of a light metal, and the metal wiring layer is used as a mask for restricting penetration of the radiating rays into regions except for the region to be irradiated.

Further, in accordance with characteristics of the present invention, there is provided a method for manufacturing a semiconductor device having a substrate, and a metal wiring layer located on the substrate, a region of the substrate being irradiated with radiating rays, the method comprises the steps of:

entirely forming the metal wiring layer, removing the metal wiring layer located on the region to be irradiated, and radiating the radiating rays using the metal wiring layer being remained as a mask.

While the novel features of the invention are set forth in a general fashion, both as to organization and content, the invention will be better understood and appreciated, along with other objects and features thereof, from the following detailed description taken in conjunction with the drawings.

THE BEST MODE OF PREFERRED EMBODIMENT TO CARRY OUT THE PRESENT INVENTION

Figure 1:
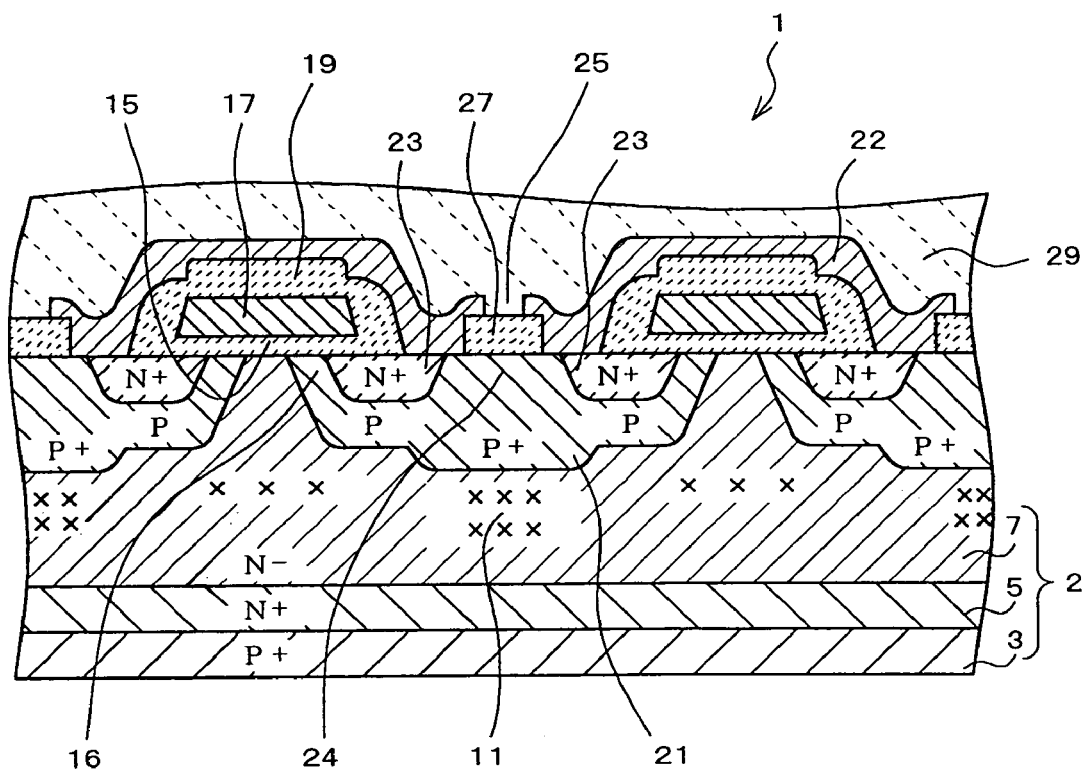
FIG. 1 is a sectional view showing part of an IGBT 1 as an embodiment of a semiconductor device in accordance with the present invention.

An embodiment of the present invention will be described herein with reference to the drawings. FIG. 1 is a sectional view showing part of an IGBT 1 as one embodiment of a semiconductor device in accordance with the present invention.

The IGBT 1 is formed on a substrate 2 for a semiconductor device. In the substrate 2, and n⁺ type layer 5 and an n⁻ type layer 7 are consecutively formed on a drain layer 3 with P⁺ type. A base region 21 with P⁺ type is formed in the n⁻ type layer 7. Source regions 23 are formed in the base region 21. The surface of the n⁻ type layer 7 is covered with a gate oxidation layer 15. A gate electrode 17 is formed on the gate oxidation layer 15. The gate electrode 17 is covered with an inter-insulating layer 19, and a source electrode 22 made of aluminum is formed on the inter-insulating layer 19. The source electrode 22 formed as a wiring layer mad of a metal is also used for electrically connecting with the source regions 23 in the IGBT element. A passivation layer 29 covers the entire surface of the source electrode 22. The first conductive type and the second conductive type are respectively defined as n type and p type in this embodiment.

A silicon oxidation layer 27 is formed on a region 24 located between the source regions 23 formed within the base regions 21. Further, the source electrode 22 is not present at an upper part of the silicon oxidation layer 27, and an opening 25 is located on the silicon oxidation layer 27. On the other hand, a crystal defect region 11 is formed at a position in the n⁻ type layer 7 and below the silicon oxidation layers 27.

Figure 2:
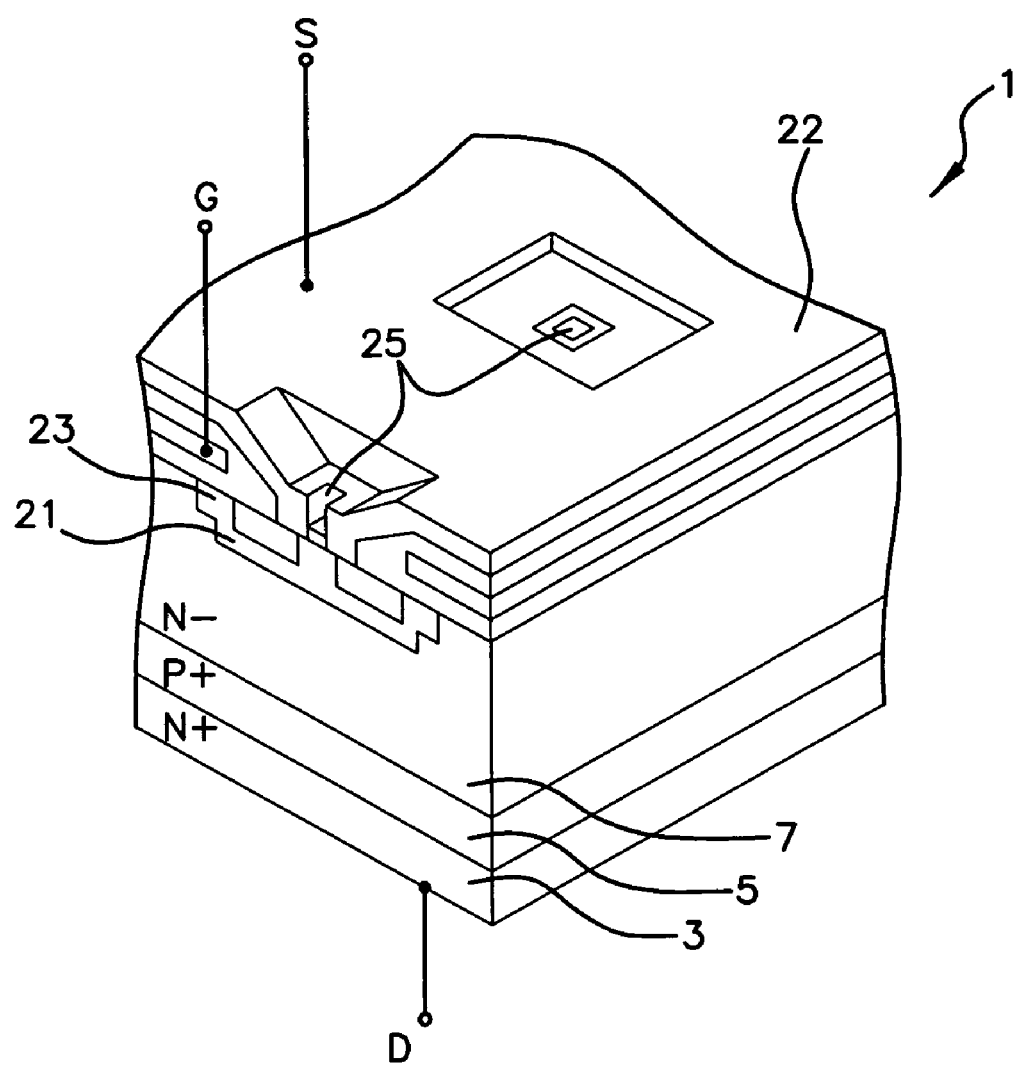
FIG. 2 is a perspective view of the IGBT 1.

FIG. 2 is a perspective view of the IGBT 1 before forming the passivation layer 29. As described, the silicon oxidation layer 27 is formed above the crystal defect region 11, and the opening 25 is located on the silicon oxidation layers 27. In this way, the source electrode 22 made of aluminum can be used both for a wiring, and a mask for the beams.

Figure 4A:
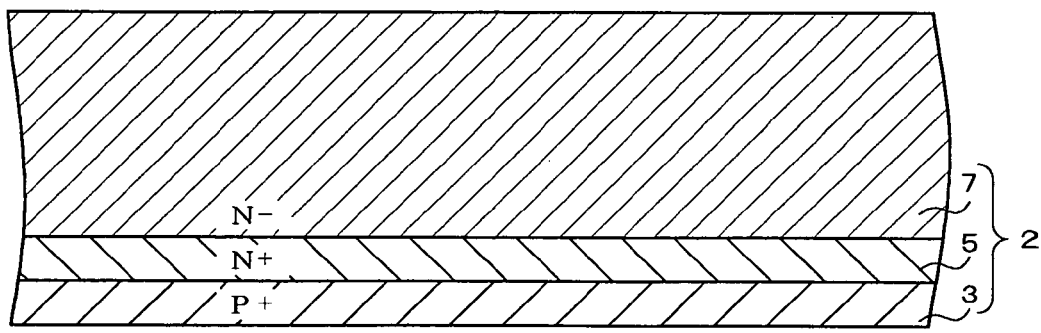
FIG. 4A through FIG. 4C are sectional views showing the manufacturing process of the IGBT 1.
Figure 4B:
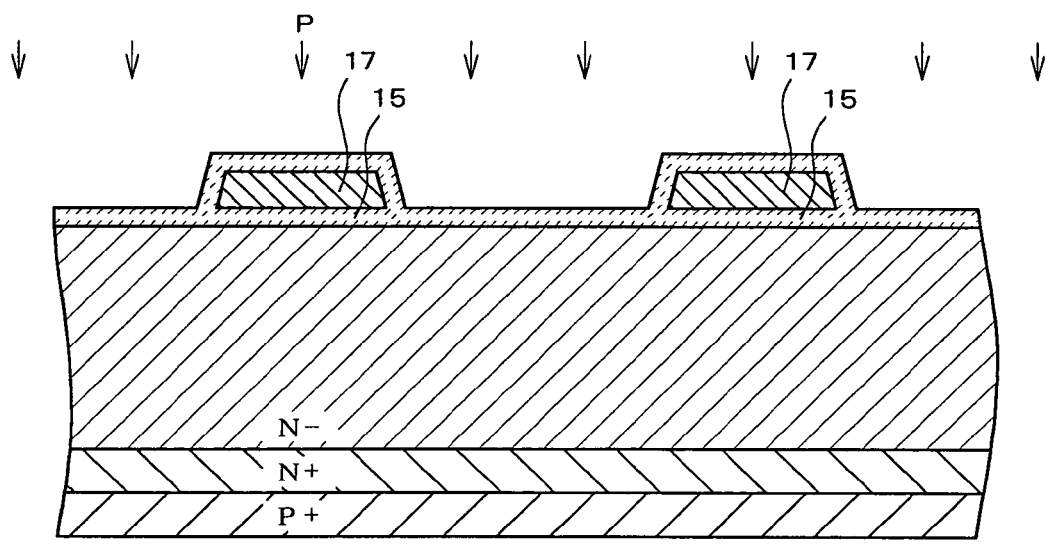
Figure 4C:
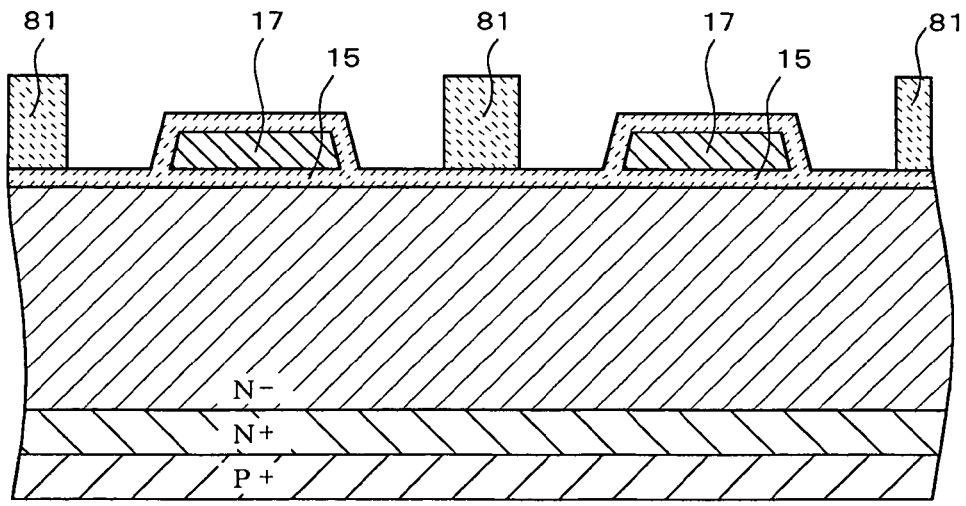
Figure 5A:
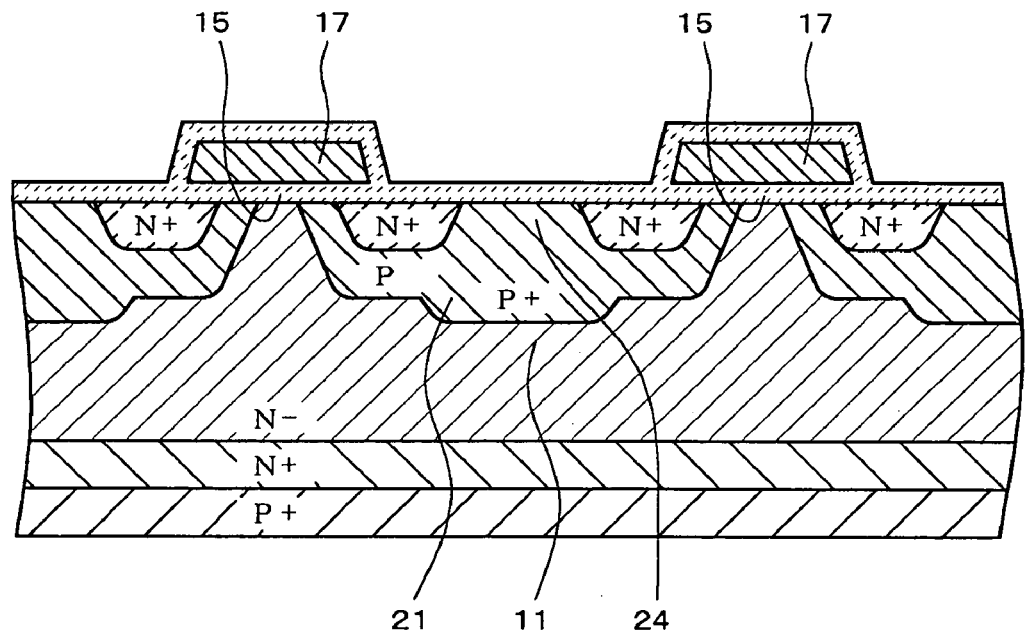
FIG. 5A and FIG. 5B are other sectional views showing the manufacturing process of the IGBT 1.

Next, a method for manufacturing the IGBT 1 will be described. The manufacturing processes similar to an ordinary IGBT are carried out until forming the source regions 23. In other words, the substrate 2 is formed by consecutively forming the n⁺ type layer 5 on the drain layer 3 and the n⁻ type layer 7 thereon as shown in FIG. 4A. Thereafter, the gate oxidation layer 15 and the gate electrode 17 are formed successively as shown in FIG. 4B. Ion implantation of P-type impurities is carried out by using the gate electrode 17 as a mask. Further, N-type impurities are implanted ionically by using both resist layers 81 formed on the gate oxidation layer 15 and the gate oxidation layers 17 as a mask as shown in FIG. 4C. The base region 21 with P⁺ type and a pair of the source regions 23 located in the base region 21 are formed simultaneously by carrying out thermal treatment as shown in FIG. 5A.

Figure 5B:
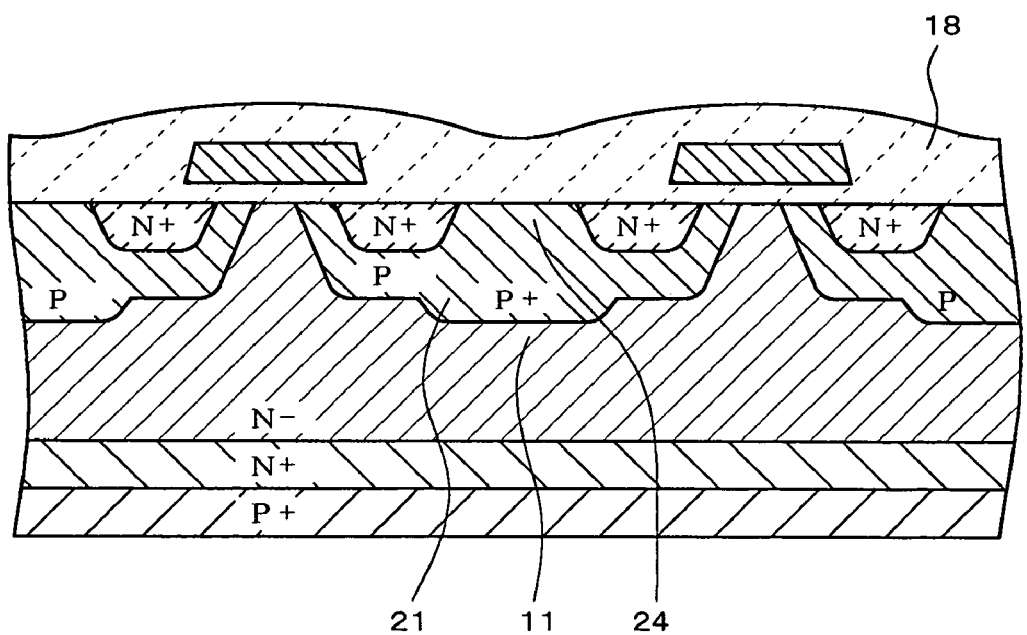
Figure 6A:
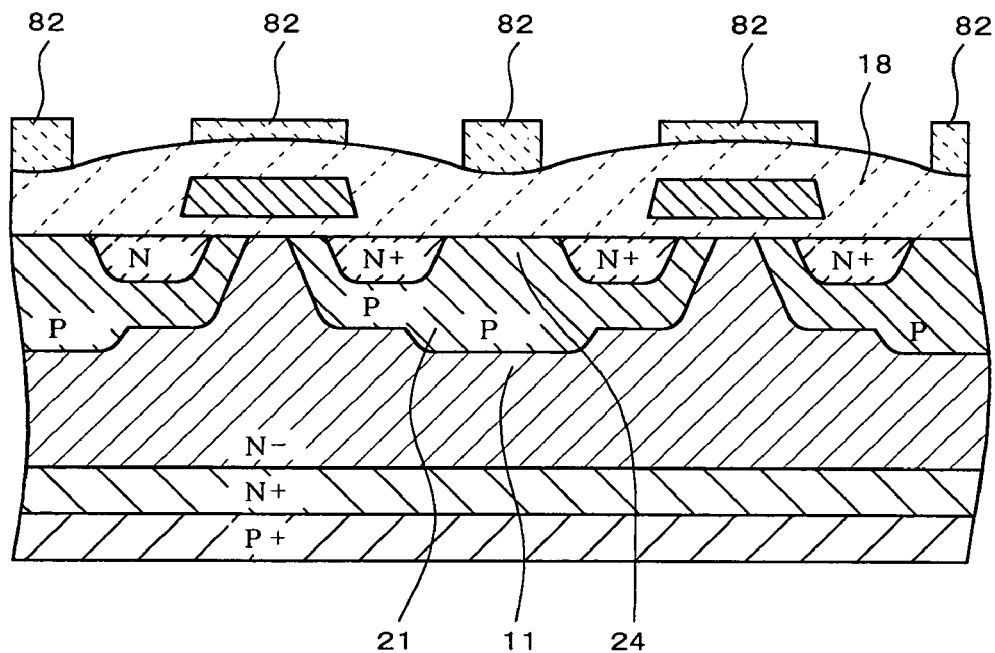
FIG. 6A and FIG. 6B are yet other sectional views showing the manufacturing process of the IGBT 1.
Figure 6B:
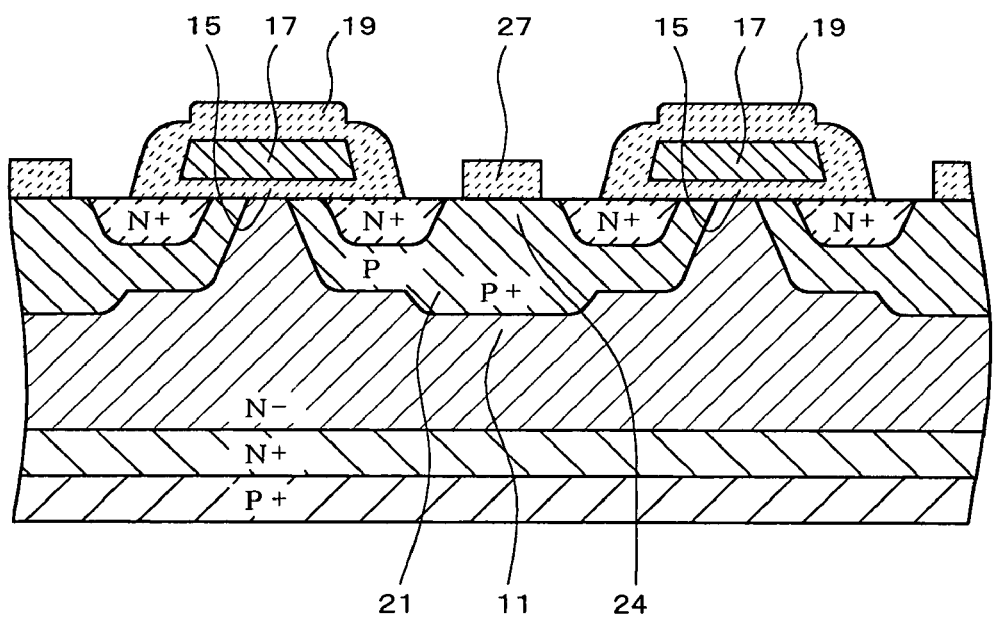

Next, a silicon oxidation (SiO₂) layer 18 is accumulated entirely on the substrate with the chemical vapor deposition (CVD) method as shown in FIG. 5B. A resist layer 82 is formed above both the crystal defect region 11 and the gate electrode 17 as shown in FIG. 6A. Both the inter-insulation layer 19 and the silicon oxidation layer 27 are formed with an etch-back technique by using the resist layers 82. In this way, the silicon oxidation layer 27 is formed above the crystal defect region 11 as shown in FIG. 6B.

Figure 7A:
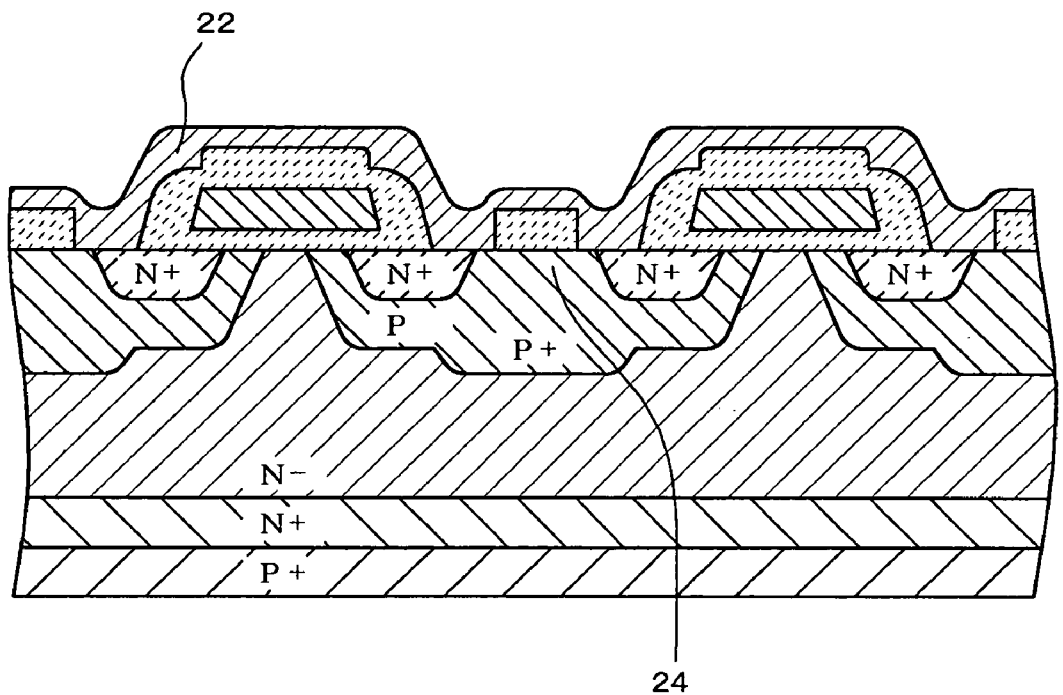
FIG. 7A and FIG. 7B are still other sectional views showing the manufacturing process of the IGBT 1.

Next, aluminum is accumulated entirely on the substrate in thickness of 5 μm with CVD method as shown in FIG. 7A.

Figure 7B:
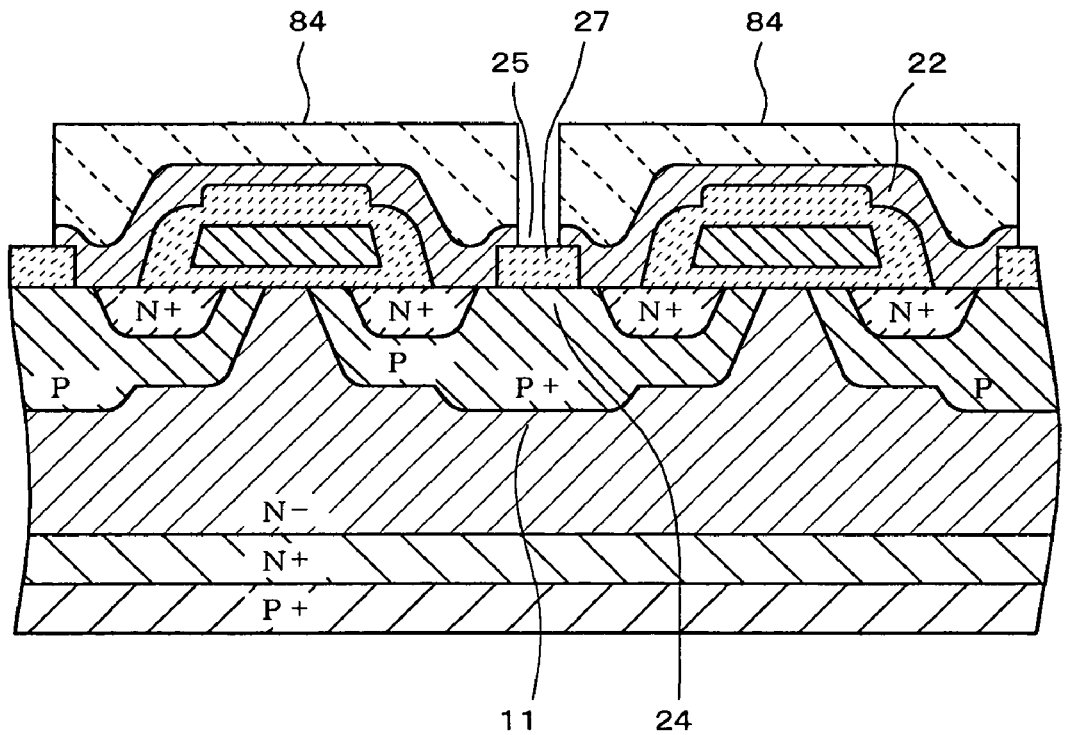

As shown in FIG. 7B, the source electrode 22 is formed by carrying out etching using a resist layer 84 being formed. As a result of the etching, the opening 25 is formed on the silicon oxidation layer 27.

Figure 8:
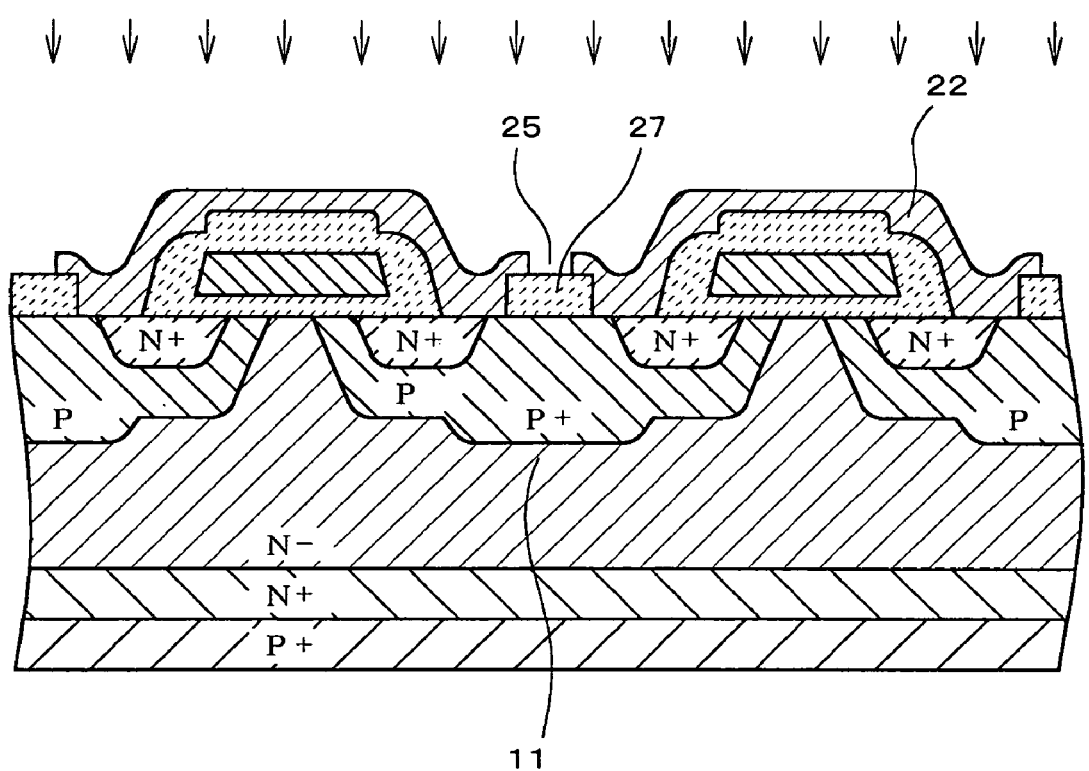
FIG. 8 is yet another sectional view showing the manufacturing process of the IGBT 1.
Figure 9:
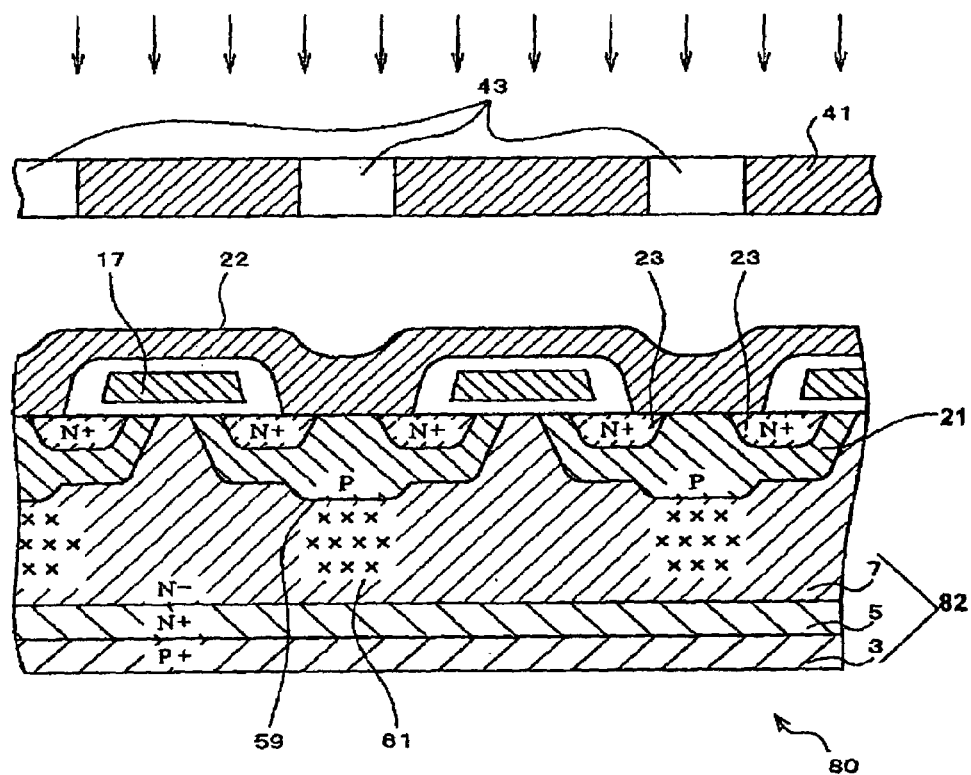
FIG. 9 is a sectional view of the IGBT 80 in the conventional technology.
Figure 10:
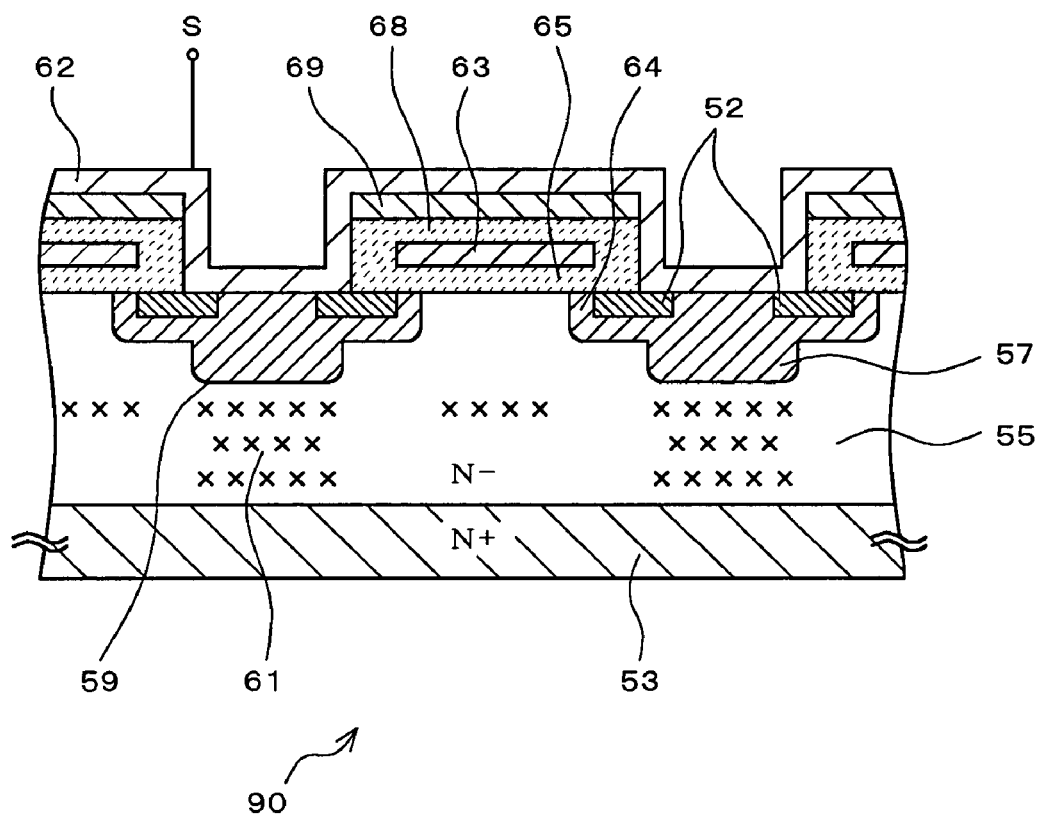
FIG. 10 is a sectional view of another IGBT 90 in the conventional technology.

The crystal defect region 11 is irradiated by the electro-beams radiated from above after removing the resist layer 84 as shown in FIG. 8. The radiation of the beam is carried out at 1 mega electro-volts in energy strength in this embodiment.

By carrying out the irradiation, the crystal defect region 11 uncovered with the source electrode 22 is irradiated by the beams, so that desired crystal defects are generated within the region 11. On the other hand, less intensity of the beams are irradiated to regions existing outside of the region 11. Although, a certain amount of crystal defects are generated in the regions existing outside of the region 11, these defects can be removed by annealing carried out later. In this way, the IGBT 1 shown in FIG. 1 is manufactured.

Figure 3:
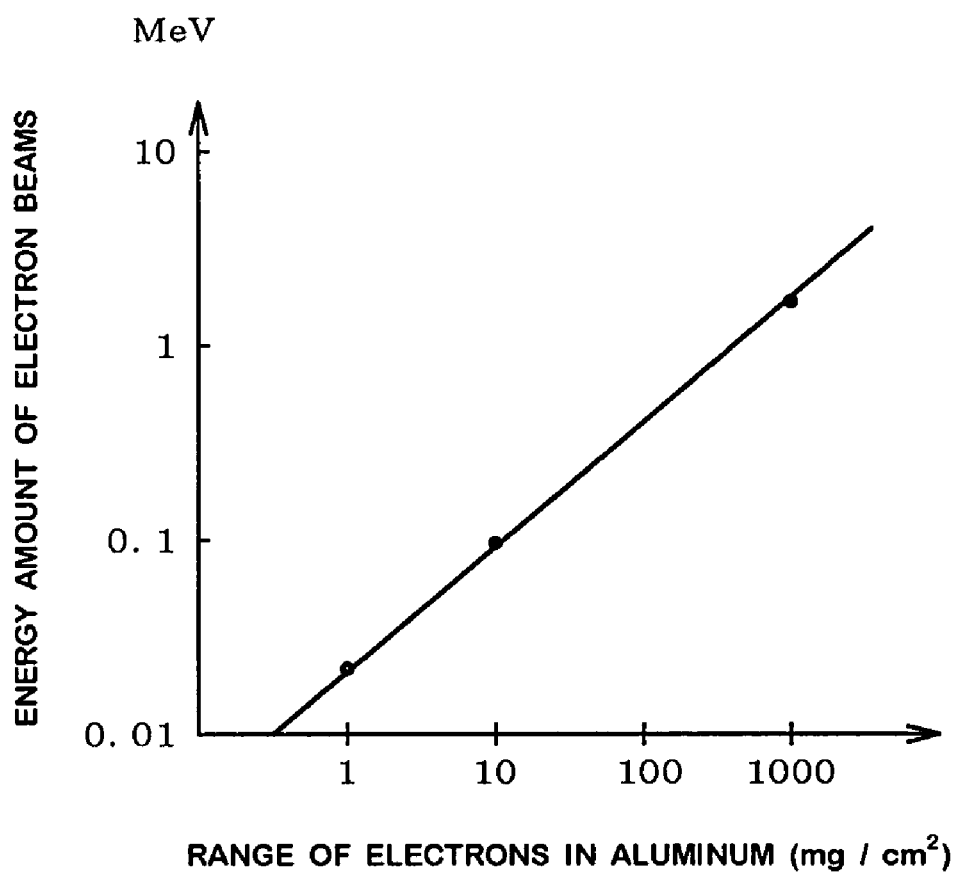
FIG. 3 is a graph showing a relationship between a range of electrons in the source electrode 22 and energy amount of the electron-beams.

Next, thickness of the source electrode 22 is described hereunder with reference to a relationship between a range of electrons in the source electrode 22 and energy amount of the beams. As shown in FIG. 3, the range of electrons in aluminum is increased when a higher energy is radiated. Usually, energy strength of the beams forming the crystal defect region is in a range from 600 electro-volts to 1 mega electro-volts. The source electrode 22 in thickness of 0.6 cm to 1 cm is required in order to restrict the generation of the crystal defect region with the source electrode 22 alone. However, the source electrode 22, relatively thicker than an ordinary aluminum wiring having a range from 1 μm to 10 μm, is able to restrict the beams because the beams are restricted by the gate electrode 17, the passivation layer 19 and the other layers formed thereunder.

Further, the generation of bremsstrahlung caused by the source electrode 22 made of a heavy metal can be avoided even when the beams are directly radiated to the source electrode 22 exposed to the air. Because the source electrode 22 is made of a light metal in this embodiment. In this way, only a desired region is irradiated with beams by using the source electrode made of aluminum capable of being used both as a wiring and a mask for the beams as a result of making an opening at a region to be irradiated without forming a layer for restricting beams in addition to the layers described above.

Although, the beams are radiated after removing the resist layer 84, the radiation can be carried out without removing the resist layer 84.

Although, the present invention is applied to the IGBT in the embodiments described above, the present invention is also applicable to other types of semiconductors such as a power MOSFET transistor and the like used as a vertical type MOSFET. Further, the present invention can also be used in any semiconductor devices such as ordinary bipolar transistor or others as long as the semiconductor requires the radiation of the beams to a part of the substrate thereof.

Although, the source electrode 22 is made of aluminum, other light metals not causing bremsstrahlung such as an aluminum silicon and the like can be used for the source electrode 22. Any other metals not causing bremsstrahlung such as copper can be used for the source electrode 22. Because of its higher density than that of aluminum, the use of copper allows radiation of the beams to the desired region even when its profile is in a thin form. Further, tungsten can also be used for the source electrode 22.

Although, the IGBT is employed as a semiconductor having the region to be irradiated in the embodiment described above, the present invention can be applied to a semiconductor device having the IGBT.

Further, the silicon oxidation layer 27 is provided in order to form the opening 25 located above the crystal defect region 11 in the embodiment. However, the opening can be formed directly on the source electrode 22 by carrying out etching thereto without providing the silicon oxidation layer.

The semiconductor device in accordance with the present invention is characterized in that, the metal wiring layer is made of a light metal. Therefore, no generation of bremsstrahlung is observed even when the radiation is radiated. Also, the metal wiring layer located on the region to be irradiated is formed thinner than that formed on regions except for the region to be irradiated so as to reach the radiating rays to the region to be irradiated. In this way, the crystal defect region can only be formed in the desired region. As a result, it is possible to provide a semiconductor device capable of radiating the radiating rays to the desired region with simple processes, while not providing adverse effects caused by bremsstrahlung even when the radiating rays are radiated. Also, the semiconductor device in accordance with the present invention is characterized in that, the metal wiring layer located on the regions except for the region to be irradiated is formed in a thickness so as not to provide any adverse effect on the regions except for the region to be irradiated. Therefore, it is possible to avoid adverse effect on the regions except for the region to be irradiated.

Further, the semiconductor device in accordance with the present invention is characterized in that, the metal wiring layer is made of a light metal, and the metal wiring layer is used as a mask for restricting penetration of the radiating rays into region except for the region to be irradiated. Therefore, it is possible to provide a semiconductor device capable of receiving the radiating rays only to the desired region with simple processes, while not providing the adverse effects caused by bremsstrahlung even when the radiating rays are radiated.

The semiconductor device in accordance with the present invention is characterized in that, the semiconductor device is an insulated gate bipolar transistor (IGBT), and the region to be irradiated is a positive-negative junction region where a parasitic diode is generated. Therefore, it is possible to provide an IGBT capable of overcoming a loss arising at the switching caused by generation of a parasitic diode.

Also, the semiconductor device in accordance with the present invention is characterized in that, the semiconductor device is a MOSFET, and the region to be irradiated is a positive-negative junction region where a parasitic diode is generated. Therefor, it is possible to provide a MOSFET capable of overcoming a loss arising at the switching caused by generation of a parasitic diode with a simple structure.

Further, the method for manufacturing a semiconductor device in accordance with the present invention is characterized in that, the method comprises the steps of entirely forming the metal wiring layer, removing the metal wiring layer located on the region to be irradiated, and radiating the radiating rays using the metal wiring layer remaining as a mask. Therefore, it is possible to provide a semiconductor device capable of radiating the radiating rays only to the desired region with simple processes without causing any adverse effects caused by bremsstrahlung even when the radiating rays are radiated.

The semiconductor device in accordance with the present invention is characterized in that, the metal wiring layer is made of a metal which prevents the generation of bremsstrahlung even when the radiating rays are radiated, and the metal wiring layer located on the region to be irradiated is formed thinner than that formed on regions except for the regions to be irradiated so as to reach the radiating rays to the region to be irradiated. In this way, the crystal defect region can only be formed in the desired region. As a result, it is possible to provide a semiconductor device capable of radiating the radiating rays only to the desired region with simple processes, while not providing adverse effects caused by bremsstrahlung even when the radiating rays are radiated.

While the invention has been described in its preferred embodiments, it is to be understood that the words which have been used are words of description rather than limitation and that changes within the purview of the appended claims can be mad without departing from the true scope and spirit of the invention in its broader aspects.

What is claimed is:

1. A semiconductor device comprising:
    a substrate having a regions irradiated with radiating rays,
    crystal defects within the regions irradiated,
    impurity regions formed in the substrate, and
    a metal wiring layer located over the entire substrate except at openings above the regions irradiated, wherein radiating rays passing to the regions irradiated through the openings generate the crystal defects under the openings and so that a smaller amount of radiating rays are irradiated elsewhere in said substrate as compared with said regions under the openings, the metal wiring layer being connected to each of the impurity regions, the metal wiring layer being made of a light metal.

2. The semiconductor device in accordance with claim 1, wherein the metal wiring layer is formed in a thickness so the smaller amount of radiating rays are irradiated elsewhere in said substrate except the regions under the openings.

3. The semiconductor device in accordance with claim 2, wherein an insulating layer is formed above the regions irradiated, the openings being on the insulating layer.

4. The semiconductor device in accordance with claim 3, wherein the metal wiring layer covers a part of the insulating layer.

5. The semiconductor device in accordance with claim 4, wherein the semiconductor device is an insulated gate bipolar transistor, wherein one of the impurity regions is a source region, and wherein one of the regions irradiated is a positive-negative junction where a parasitic diode is generated.

6. The semiconductor device in accordance with claim 4, wherein the semiconductor device is a metal oxide semiconductor field effect transistor, wherein one of the impurity regions is a source region, and wherein one of the regions irradiated is a positive-negative junction region where a parasitic diode is generated.

* * * * *